(12) United States Patent
Torres et al.

(10) Patent No.: US 6,451,669 B2
(45) Date of Patent: Sep. 17, 2002

(54) METHOD OF FORMING INSULATED METAL INTERCONNECTIONS IN INTEGRATED CIRCUITS

(75) Inventors: Joaquim Torres, Saint Martin le Vinoux; Philippe Gayet, Saint Vincent de Mercuze; Michel Haond, Meylan, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/742,891

(22) Filed: Dec. 20, 2000

(30) Foreign Application Priority Data

Dec. 24, 1999 (FR) .............................. 99 16488

(51) Int. Cl.⁷ .............................................. H01L 21/76
(52) U.S. Cl. ...................... 438/409; 438/411; 438/421; 438/422; 438/619
(58) Field of Search ................... 438/409, 411, 438/421, 422, 619

(56) References Cited

U.S. PATENT DOCUMENTS

| 5,407,860 A | | 4/1995 | Stoltz et al. ............... 437/180 |
|---|---|---|---|
| 5,444,015 A | * | 8/1995 | Aitken et al. .............. 438/619 |
| 5,461,003 A | * | 10/1995 | Havemann et al. ......... 438/187 |
| 5,559,055 A | | 9/1996 | Chang et al. .............. 437/195 |
| 5,641,712 A | | 6/1997 | Grivna et al. .............. 438/624 |
| 5,789,818 A | | 8/1998 | Havemann ................. 257/750 |
| 5,792,706 A | | 8/1998 | Michael et al. ............ 438/626 |
| 6,054,381 A | * | 4/2000 | Okada ....................... 438/619 |
| 6,071,805 A | * | 6/2000 | Liu ............................ 438/619 |
| 6,093,633 A | * | 7/2000 | Matsumoto ................ 438/619 |
| 6,159,840 A | * | 12/2000 | Wang ........................ 438/619 |
| 6,242,336 B1 | * | 6/2001 | Ueda et al. ................ 438/619 |
| 6,268,276 B1 | * | 7/2001 | Chan et al. ................ 438/619 |
| 6,268,277 B1 | * | 7/2001 | Bang et al. ................ 438/619 |
| 2001/0023128 A1 | * | 9/2001 | Ueda et al. ................ 438/619 |

* cited by examiner

*Primary Examiner*—John F. Niebling
*Assistant Examiner*—Lynne A. Gurley
(74) *Attorney, Agent, or Firm*—Wolf, Greenfield & Sacks, P.C.; James H. Morris; Richard F. Giunta

(57) ABSTRACT

One embodiment of the invention is directed to a method of forming a metallization level of an integrated circuit including the steps of forming metal areas of a metallization level laterally separated by a first insulating layer, removing the first insulating layer, non-conformally depositing a second insulating layer so that gaps can form between neighboring metal areas, or to obtain a porous layer. The removal of the first insulating layer is performed through a mask, to leave in place guard areas of the first insulating layer around the portions of the metal areas intended for being contacted by a via crossing the second insulating layer.

7 Claims, 3 Drawing Sheets

METHOD OF FORMING INSULATED METAL INTERCONNECTIONS IN INTEGRATED CIRCUITS

BACKGROUND OF THE INVENTION

1. Field of the Invention

The present invention relates to the manufacturing of semiconductor integrated circuits and more specifically to the final steps of this manufacturing during which are formed, above a silicon substrate including diffused regions and selected structures, a succession of insulating layers alternating with metal layers. Each of the metal layers forms a metallization level. Each metallization level is etched according to a determined topology to establish contacts with vias connecting this metal layer to a lower metal layer and to an upper metal layer. The highest layer is connected to contact pads and the lowest layer is connected by vias to portions of the semiconductor substrate and/or to polysilicon regions.

2. Discussion of the Related Art

Successive problems of via formation within a dielectric layer, of dielectric layer etching and of metal layer etching are thus raised. Various methods have been developed in the art to form such interconnection layers and these methods are now well tried and tested with conventional materials such as silicon oxide and aluminum.

However, as technical developments lead to reducing the sizes of elementary components in the silicon, the sizes of the patterns formed in the various metallization layers are similarly reduced and the metallizations are brought closer to one another. This results, in particular, in an increase of vertical stray capacitances between metal layers of different levels and of lateral stray capacitances between portions of metallizations of the same level. To avoid increasing the value of the stray capacitances, which reduces the maximum circuit switching rate, dielectrics having smaller dielectric constants than that of silicon oxide are desired to be used. However, a common disadvantage of many of these dielectrics is that they are difficult to etch.

It has also been attempted to use conductive materials more conductive than aluminum, such as copper. Again, with such elements, great difficulties arise to etch these materials in a localized way, for example to form trenches with steep sides or to electrically insulate the patterns from one another.

These problems have been solved, especially by the techniques described in U.S. patent application Ser. No. 09/196,851, which in incorporated herein by reference, which also describes various known methods of interconnection structure formation.

To further reduce lateral stray capacitances between portions of metallizations of the same level, it has been suggested to perform insulator depositions so that there remains a void (an air bubble) between neighboring metallization portions of the same level. Porous insulator depositions have also been provided. This raises new problems that the present invention aims at solving.

SUMMARY OF THE INVENTION

Thus, an object of the present invention is to provide a novel method of implementing structures including several conductive levels separated by insulating layers locally crossed by vias filled with metal.

Another object of the present invention is to provide such a method in which pores or voids are made between neighboring metallizations of a same level.

To achieve these and other objects as well as others, the present invention provides a method of forming a metallization level of an integrated circuit including the steps of forming metal areas of a metallization level laterally separated by a first insulating layer, removing the first insulating layer, non-conformally depositing a second insulating layer so that gaps can form between neighboring metal areas, or to obtain a porous layer. The removal of the first insulating layer is performed through a mask, to leave in place guard areas of the first insulating layer around the portions of the metal areas intended to be contacted by a via crossing the second insulating layer.

According to an embodiment of the present invention, the metal areas are copper, silver, or gold areas, or are made of several alloys of copper with materials selected from the group including aluminum, silicon, manganese, and cobalt.

According to an embodiment of the present invention, the second insulating layer, non-conformally deposited so that gaps can form, is made of a material selected from the group including silicon oxide, and fluorine- or carbon-doped silicon oxides, deposited by chemical vapor deposition.

According to an embodiment of the present invention, the second insulating layer, intended for providing a porous layer, is an aerogel or a xerogel.

The foregoing objects, features and advantages of the present invention, will be discussed in detail in the following non-limiting description of specific embodiments in connection with the accompanying drawings.

DETAILED DESCRIPTION

The various drawings are simplified cross-section views and, as usual in the representation of semiconductor components, they are not drawn to scale.

Figure 1:
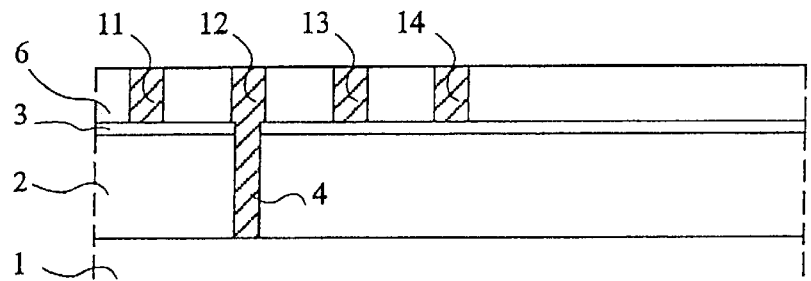
FIGS. 1 to 4 illustrate successive steps of formation of interconnections by a method according to an embodiment of the present invention.

FIG. 1 shows an interconnection structure at an intermediary stage of its manufacturing, such as illustrated for example in the above-incorporated patent application in FIG. 3D or 4F. This structure is formed on a substrate 1 corresponding to an intermediary manufacturing level of an integrated circuit. As an example, the high portion of substrate 1 may correspond to a metallization extending in the plane of the drawing. Above substrate 1 is formed an insulating layer 2, formed of one or several insulating materials and preferably topped with a thin insulating layer 3 that can be selectively etched with respect to insulating layer 2. For example, insulating layer 2 will be made of silicon oxide and insulating layer 3 will be made of silicon nitride. However, any other insulator set or pair may be used. Reference can especially be made to the materials described in the above-mentioned patent application. Insulating layers 2 and 3 are crossed by an opening filled with a conductive material 4 forming a via contacting a conductive layer of substrate 1.

Above insulating layer 3 the upper surface of via 4 is formed a metallization level. In FIG. 1, portions of metallizations embedded in an insulating layer 6 have been shown, in accordance with what has been described in the drawings of incorporated U.S. patent application Ser. No. 09/196,851. The choice of such a structure as an initial structure is one of the aspects of the present invention. In the fragmentary cross-section view of FIG. 1, metallization portions 11, 12, 13, and 14 corresponding, for example, to interconnection line sections extending perpendicularly to the plane of the drawing have been shown. Metallization 12 contacts the upper surface of via 4. Metallization 13 is intended to be contacted by a via formed in a subsequent step. Of course, it may also be provided to form a via above metallization 12, itself in contact with via 4. It should be understood that in a cross-section view of an entire integrated circuit chip, a very large number of metallizations similar to those illustrated in FIG. 1 would appear. Further, generally, there exist on the upper surface of a chip, on the one hand, areas where metallizations extending parallel to one another and as close as possible to one another in a way compatible with the manufacturing technology are present and, on the other hand, areas, such as the area located in the right-hand portion of FIG. 1, in which there are no metallizations or in which there only are metallizations very distant from one another.

In an example of embodiment of the present invention, vias 4 and/or the metallization level including regions 11 to 14 are formed of a tantalum nitride bonding layer and of a layer of a metal such as copper, or copper and aluminum alloys, or tungsten. The insulating layer 2 separating the neighboring vias may be formed of a silicon oxide layer coated with a silicon nitride layer. Similarly, insulating layer 6 may be a silicon oxide layer, possibly coated with a silicon nitride layer (not shown).

Generally, the present invention aims at a structure of metallization layers of the type of that shown in FIG. 1, in which metal portions are embedded in an insulating layer 6 separating them.

At a subsequent step of an embodiment of the present invention, it is desired to form gaps or "air bubbles" between neighboring metallizations. For this purpose, insulating layer 6 must be removed between the neighboring metallization lines 11 to 14. According to the present invention, before performing a selective etching for removing insulator 6, a masking layer, portions 16 and 17 of which are shown in FIG. 2, is deposited.

Figure 2:
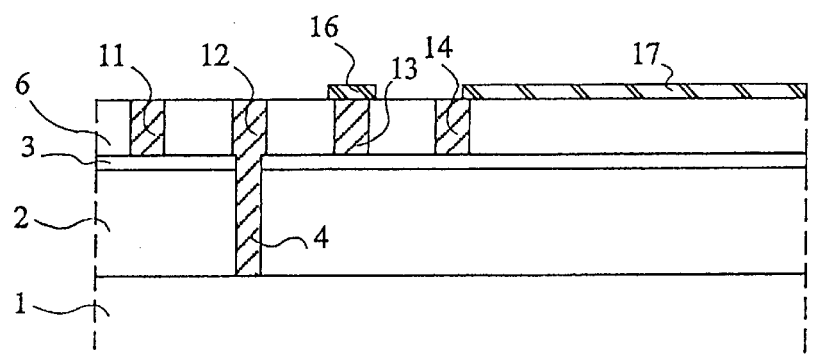

Masking layer portion 16 is arranged at a location where a via must contact a metallization, metallization 13 in the example of FIG. 2. This masking layer portion 16 laterally extends slightly beyond metallization 13. In fact, it will be understood that the mask used to form masking layer 16 is similar to the mask that will be used to define the vias at the next step. However, the mask used to form masking layer 16 exhibits openings slightly widened with respect to the mask of the vias.

Masking layer portion 17 covers areas in which no metallizations close to one another are found. A portion 17 of the masking layer will also be provided between metallizations having a large distance between one another, for example a distance that is double the minimum distance existing between metallizations 11 to 14.

Figure 3:
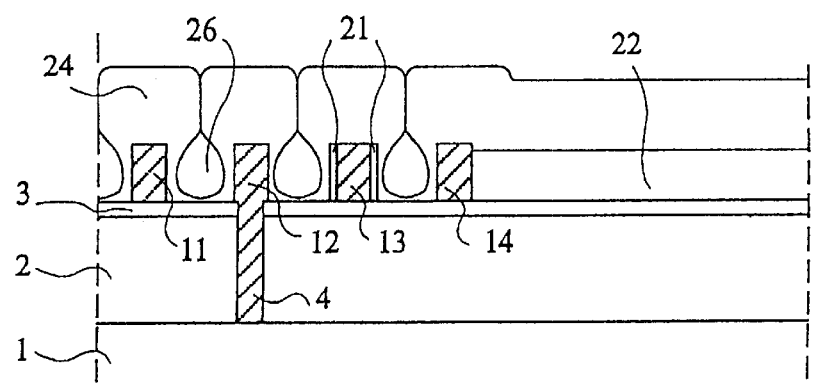

To achieve the structure illustrated in FIG. 3, a selective anisotropic etching of insulating layer 6 is first performed, so that metallizations 11 to 14 and portions 21 and 22 of layer 6 respectively arranged under masking layer 16 and under masking layer 17 remain in place. Portion 21 corresponds to a lateral guard area around the portion of metallization 13 which is to be contacted by a via. A layer of an insulator is then deposited by nonconformal deposition, to obtain an insulating layer 24 that includes gaps or "air bubbles" 26 between the neighboring metallizations 11–12, 12–13, 13–14.

Due to the maintenance of insulating layer 22, which has substantially the same height as metallizations 11, 12, 13, 14, outside of the regions where close interconnection lines are present, the upper surface of insulating layer 24 is substantially planar after its deposition. Further, an additional insulating layer (not shown), for example, a silicon nitride layer, may be provided as described previously above insulating layer 24. This additional layer has the function of indicating an etch end, and possibly to form a diffusion barrier for certain materials such as copper.

Figure 4:
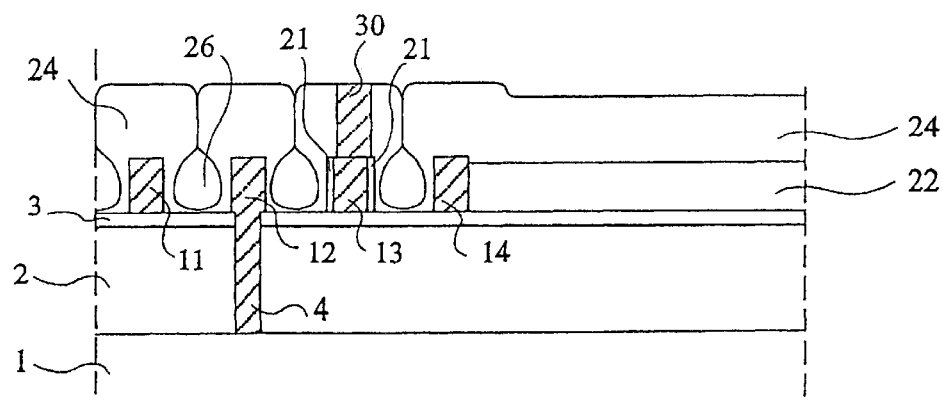

At the step illustrated in FIG. 4, vias are dug into layer 24. These vias are filled with a metal 30. This is an advantage of having previously provided guard areas 21. Indeed, in the absence of guard areas 21, due to inevitable alignment defects, metal 30 could spread into adjacent gap 26 and deprive the system of all its advantages.

Of course, the present invention is likely to have various alterations, modifications, and improvements which will readily occur to those skilled in the art. In particular, various conductive materials other than metal and various dielectrics may be used. Various etch methods may be used.

Further, the present invention will not only apply to the forming of a metallization level, but also to the forming of a level of vias. Indeed, in the case where many close vias exist, it may be desired to form an air bubble isolation between adjacent vias.

Figure 5:
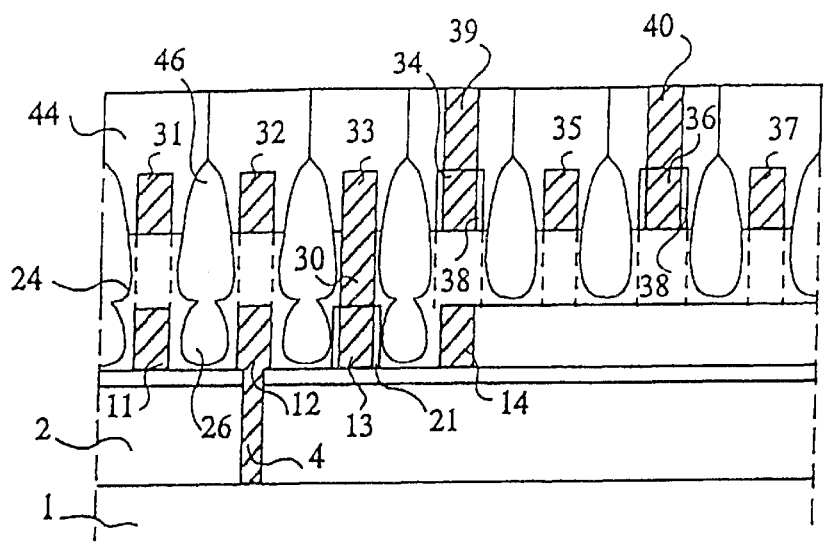
FIG. 5 shows a possible subsequent phase of implementation of a group of interconnections according to the present invention.

FIG. 5 shows an example of a structure according to the present invention at a subsequent manufacturing stage. The lower portion of this drawing shows the elements illustrated in FIG. 4. As indicated, insulating layer 24 may be topped with a thin layer of an etch stop material, for example, silicon nitride.

In FIG. 5, a second metallization level has been shown, of which portions 31 to 37 can be seen in the drawing, portion 33 contacting via 30 and portions 34 and 36 being intended for contacting subsequently formed vias 39 and 40. Before non-conformally depositing an insulating layer 44, in the same way as layer 24, a partial etching of insulating layer 24 is performed, by using metallization portions 31 to 37 as a mask. Air bubbles 46 that communicate with bubbles 26 are thus formed. As in the preceding case, metallizations 34 and 36 will have been surrounded with guard areas 38 of an insulating layer of conventional nature, for example, silicon oxide. The insulation is thus improved.

Figure 6:
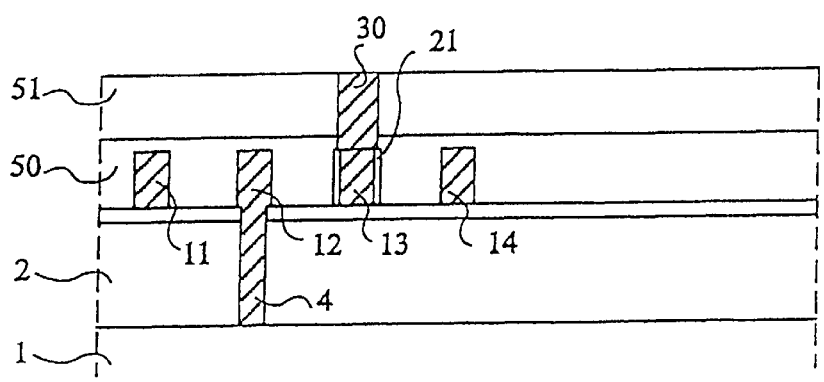
FIG. 6 shows an alternative of the present invention.

FIG. 6 shows another alternative of the present invention. According to this alternative, at the step of FIG. 2, mask portion 16 will have been used as previously above the regions to be contacted by a via, such as region 13. This mask is used to etch the structure by leaving, as previously, a guard area 21 made of a conventional insulating material such as silicon oxide around region 13 in the area where this region is to be contacted by a via. However, mask portion 17 is not used. Then, a layer of a porous material 50, for example, an aerogel or a xerogel, is deposited. Layer 50 is deposited over a sufficient thickness to fill the entire space between portions 11–14 with a metallization level and may slightly overflow above the height of this metallization level. This layer is itself coated with a layer 51 of a conventional insulating material. The porous material, like the previously-described insulating material including gaps, is likely to be significantly damaged if a metallization significantly penetrates therein. For example, if via 30 was formed in the absence of guard areas 21, there could be a lateral penetration resulting from the etching, at the edge of the metallization region, thus forming a void, then filling up with metal around or on an edge of metallization 13. The presence of guard areas 21 according to the present invention avoids this disadvantage and enables using porous materials.

Figure 7:
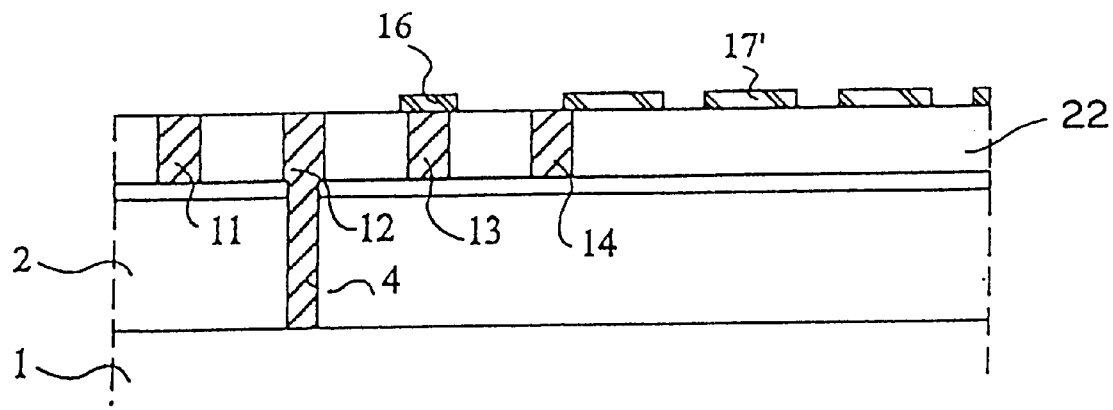
FIGS. 7 and 8 show alternatives of the steps of the present invention illustrated in FIGS.2 and 3.
Figure 8:
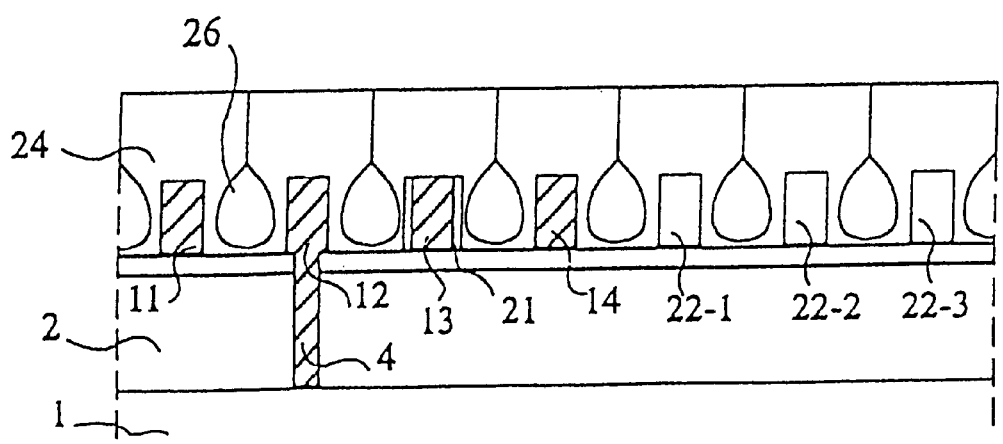

FIGS. 7 and 8 illustrate two successive steps of another alternative of the present invention. FIG. 7 shows the structure at the same stage as what has been previously described in relation with FIG. 3. The difference between the two drawings is the mask implementation. Mask portion 16 is the same as that in FIG. 3. However, instead of mask portion 17, a mask portion 17' exhibiting openings at the same pitch as metallizations 11, 12, 13, 14 is used. Thus, at the following step, illustrated in FIG. 8, which further corresponds to FIG. 3, portions 22-1, 22-2, and 22-3 of insulating layer 22, for example silicon oxide, will be found at the same pitch as metallizations 11 to 14. Then, when layer 24 is non-conformally deposited, as in the case of FIG. 3, air bubbles will form not only between the metallizations but also between the portions of insulating regions 22-1 to 22-3. This further increases the lateral isolation of the structure and solves, in other ways, the problem of planarization.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of forming a metallization level of an integrated circuit, comprising acts of:
   forming metal areas of a metallization level, including a first metal area and a second metal area, laterally separated by a first insulating layer;
   removing at least a portion of the first insulating layer, through a mask, to leave in place guard areas of the first insulating layer laterally surrounding the first metal area and so that the second metal area is not laterally surrounded by the first insulating layer and;
   depositing the second insulating layer, wherein the act of depositing includes one of depositing a second insulating layer so that gaps are formed between neighboring metal areas and depositing a second insulating layer of porous material;
   forming at least one via through the second insulating layer; and
   contacting the first metal area, but not the second metal area, to the at least one via.

2. The method of claim 1, wherein the metal areas are copper, silver, or gold areas, or are made of several alloys of copper with materials selected from the group including aluminum, silicon, manganese, and cobalt.

3. The method of claim 1, wherein the second insulating layer, non-conformally deposited so that gaps can form, is made of a material selected from the group including silicon oxide, and fluorine- or carbon-doped silicon oxides, deposited by chemical vapor deposition.

4. The method of claim 1, wherein the second insulating layer, intended for providing a porous layer, is an aerogel or a xerogel.

5. A method of forming a metallization level of an integrated circuit, comprising acts of:
   forming metal areas of a metallization level laterally separated by a first insulating layer;
   removing at least a portion of the first insulating layer to leave in place guard areas of the first insulating layer laterally surrounding at least one metal area;
   depositing a porous material to form a second insulating layer between neighboring metal areas;
   forming at least one via through the second insulating layer; and
   contacting the at least one metal area to the at least one via.

6. A method of forming a metallization level of an integrated circuit, comprising acts of:
   forming metallizations, including first and second metallizations, laterally separated by a first insulating layer;
   removing at least a portion of the first insulating layer to expose at least a portion of the second metallization and to leave a guard band surrounding the first metallization;
   depositing a second insulating layer, wherein the act of depositing includes one of depositing a second insulating layer such that gaps are formed in the second insulating layer between neighboring metallizations and depositing a second insulating layer of porous material; and
   forming at least one via through the second insulating layer so that at least one via is electrically connected to the first metallization and the second metallization is electrically isolated from each via though the second insulating layer.

7. A method of forming a metallization level of an integrated circuit, comprising acts of:
   forming a plurality of metallizations, including at least first and second metallizations, laterally separated by a first insulating layer;
   removing portions of the first insulating layer to form a guard band surrounding at least one of the first and second metallizations;
   depositing a porous second insulating layer between the first and second metallizations;
   and
   forming a via that electrically connects to the at least one of the first and second metallizations.

* * * * *